(12) United States Patent
Lee et al.

(10) Patent No.: US 8,190,851 B2
(45) Date of Patent: May 29, 2012

(54) RESISTANCE VARIABLE MEMORY DEVICE

(75) Inventors: Kwang-jin Lee, Hwaseong-si (KR);
Young-kug Moon, Suwon-si (KR);
Kwang-ho Kim, Hwaseong-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 446 days.

(21) Appl. No.: 12/617,758

(22) Filed: Nov. 13, 2009

(65) Prior Publication Data

US 2010/0125716 A1      May 20, 2010

(30) Foreign Application Priority Data

Nov. 14, 2008   (KR) .................. 10-2008-0113344

(51) Int. Cl.
*G06F 12/00* (2006.01)
(52) U.S. Cl. .... 711/204; 711/103; 711/154; 365/189.05
(58) Field of Classification Search .................. 711/204, 711/103, 154; 365/189.05
See application file for complete search history.

(56) References Cited

U.S. PATENT DOCUMENTS

| 5,305,284 A * | 4/1994 | Iwase ........................ 365/238.5 |
| 6,681,302 B2 * | 1/2004 | Cho et al. ...................... 711/154 |
| 7,099,179 B2 | 8/2006 | Rinerson et al. |

FOREIGN PATENT DOCUMENTS

| JP | 08-180675 | 7/1996 |
| KR | 10-0180929 | 4/1999 |

* cited by examiner

*Primary Examiner* — Stephen Elmore
(74) *Attorney, Agent, or Firm* — Volentine & Whitt, PLLC

(57) ABSTRACT

A resistance variable memory device includes a resistance variable memory cell array, a data register that prefetches read data of the resistance variable memory cell array, a data output unit that receives the prefetched read data from the data register and outputs the received data, and a page mode setting unit that sets one of a first page mode and a second page mode as a page mode. In the first page mode, the data output unit sequentially reads the read data prefetched in the data register as page addresses are sequentially received, and in the second page mode, the data output unit sequentially reads the read data prefetched in the data register after a start page address among a plurality of page addresses has been received.

15 Claims, 10 Drawing Sheets

RESISTANCE VARIABLE MEMORY DEVICE

PRIORITY CLAIM

A claim of priority is made to Korean Patent Application No. 10-2008-0113344, filed Nov. 14, 2008, in the Korean Intellectual Property Office, the disclosure of which is incorporated herein in its entirety by reference.

SUMMARY

The inventive concept generally relates to semiconductor memory devices, and more particularly, the inventive concept relates to resistance-variable memory devices, such as phase-change random access memory (PRAM) devices.

Resistance variable memory cells are generally characterized by a volume of material which is capable of having its resistive characteristics stabilized at two or more different resistive states. Read circuitry is capable of distinguishing between resistive states, and in this manner data is stored in the resistance variable memory cell. For example, a phase-change random access memory (PRAM) utilizes the variable-resistance characteristics of a phase-change material (e.g., Ge-Sb-Te or GST) to store data. In PRAM devices, a material phase of the phase-change material can be stably programmed to different resistive states by subjecting the material to heat treatment processes (e.g., joule heating processes). In addition to advantages realized by dynamic random assess memory (e.g., conventional DRAM), PRAM devices may be non-volatile memory with relatively low-power consumption.

According to an aspect of the inventive concept, a resistance variable memory device is provided which includes a resistance variable memory cell array, a data register that prefetches read data of the resistance variable memory cell array, a data output unit that receives the prefetched read data from the data register and outputs the received data, and a page mode setting unit that sets one of a first page mode and a second page mode as a page mode. In the first page mode, the data output unit sequentially reads the read data prefetched in the data register as page addresses are sequentially received, and in the second page mode, the data output unit sequentially reads the read data prefetched in the data register after a start page address among a plurality of page addresses has been received.

According to another aspect of the inventive concept, a resistance variable memory device is provided which includes a first resistance variable memory cell array, a second resistance variable memory cell array, a first data register that prefetches read data of the first resistance variable memory cell array, a second data register that prefetches read data of the second resistance variable memory cell array, a data output unit that receives the prefetched read data from the first and second data registers and outputs the received data, and a page mode setting unit that sets one of a first page mode and a second page mode as a page mode. In the first page mode, the data output unit sequentially reads the read data prefetched in the first data register as page addresses of the first resistance variable memory cell array are sequentially received, and then sequentially reads the read data prefetched in the second data register as page addresses of the second resistance variable memory cell array are sequentially received. In the second page mode, the data output unit sequentially reads the read data prefetched in the first data register when a start page address of the first resistance variable memory cell block is received, and then sequentially reads the read data prefetched in the second data register when a start page address of the second resistance variable memory cell array is received.

According to yet another aspect of the inventive concept, a resistance variable memory device is provided which includes a resistance variable memory cell array, a data register that prefetches read data of the resistance variable memory cell array, a data output unit that receives the prefetched read data from the data register and outputs the received data, and a common address/data pin that receives page addresses and receives the read data from the data output unit, and outputs the received read data. The data output unit sequentially reads the read data prefetched in the data register through the common address/data pin after a start page address among a plurality of page addresses has been received through the common address/data pin.

BRIEF DESCRIPTION OF THE DRAWINGS

The above and other aspects and features of the inventive concept will become readily apparent from the detailed description that follows, with reference to the accompanying drawings, in which.

DETAILED DESCRIPTION OF EMBODIMENTS

The inventive concept will be described below by way of preferred, but non-limiting, embodiments of the invention. The embodiments presented herein are considered examples of various implementations of the invention, and are not intended to limit or specifically define the overall scope of the invention.

For ease of understanding and to avoid redundancy, like reference numbers refer to the same or similar elements throughout the drawings. Also, while the drawings contain a number of circuit elements, it will be understood from the nature of electrical circuits that when an element is described as being connected to another element, it can be directly connected the other element or one or more intervening elements may be present. In contrast, if an element is referred to as being "directly connected to" another element, then no intervening elements are present. Other words used to describe the relationship between elements should be interpreted in a like fashion (e.g., "between" versus "directly between," "adjacent" versus "directly adjacent," "connected" versus "directly connected," etc.).

Figure 1:
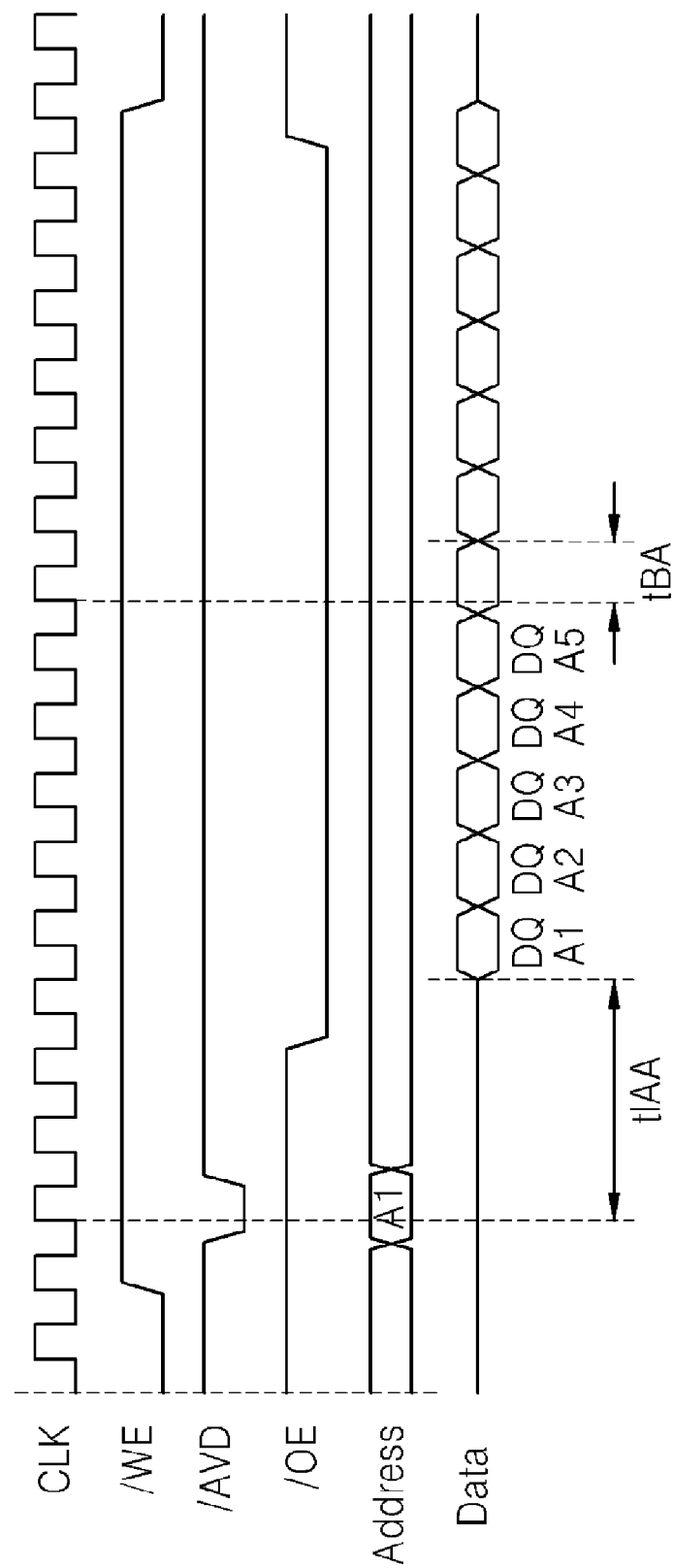
FIG. 1 is a timing diagram for reference in describing a synchronous read operation and a burst mode in a memory device.

FIG. 1 is a timing diagram for reference in describing a synchronous read operation and a burst mode in a memory device. In FIG. 1, CLK denotes a clock signal, /WE denotes a write (and/or read) enable signal, /AVD denotes a valid address signal, and /OE denotes an output enable signal.

Referring to FIG. 1, in the synchronous read operation, data DQA1~DQA5 are respectively read during a clock (CLK) cycle. After an initial latency t1AA has elapsed from the receipt of an address A1, the plural data DQA1~DQA5 are sequentially read. A read mode in which a predetermined number of data DQA1~DQA5 are sequentially read in synchronization with a continuous clock cycle is referred to as burst mode. In the burst mode, a predetermined number of data are sequentially read which allows the semiconductor memory device to operate at a relatively high speed.

Figure 2:
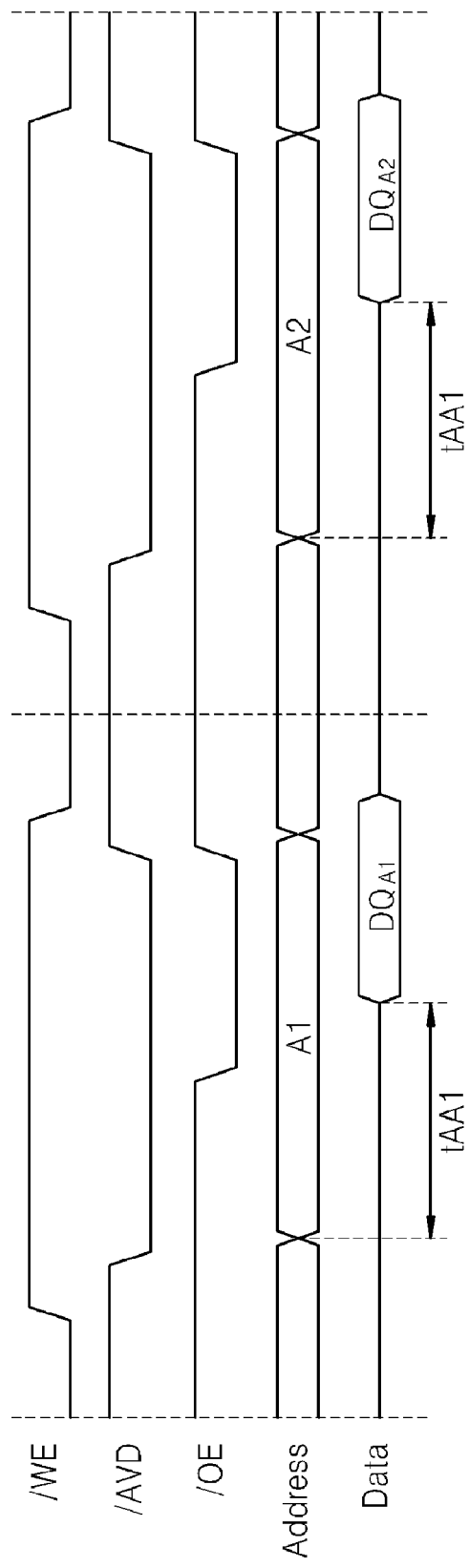
FIG. 2 is a timing diagram for reference in describing an example of an asynchronous read operation in a memory device.

FIG. 2 is a timing diagram for explaining an example of an asynchronous read operation in a memory device. Referring to FIG. 2, after a latency tAA1 has passed from the receipt of a first address A1, a first data DQA1 is read. Next, after the latency tAA1 has passed from the receipt of a second address A2, a second data DQA1 is read. Unlike the synchronous read operation in FIG. 1, the data DQA1 and DQA2 are intermittently read in the asynchronous read operation as represented in FIG. 2.

Figure 3:
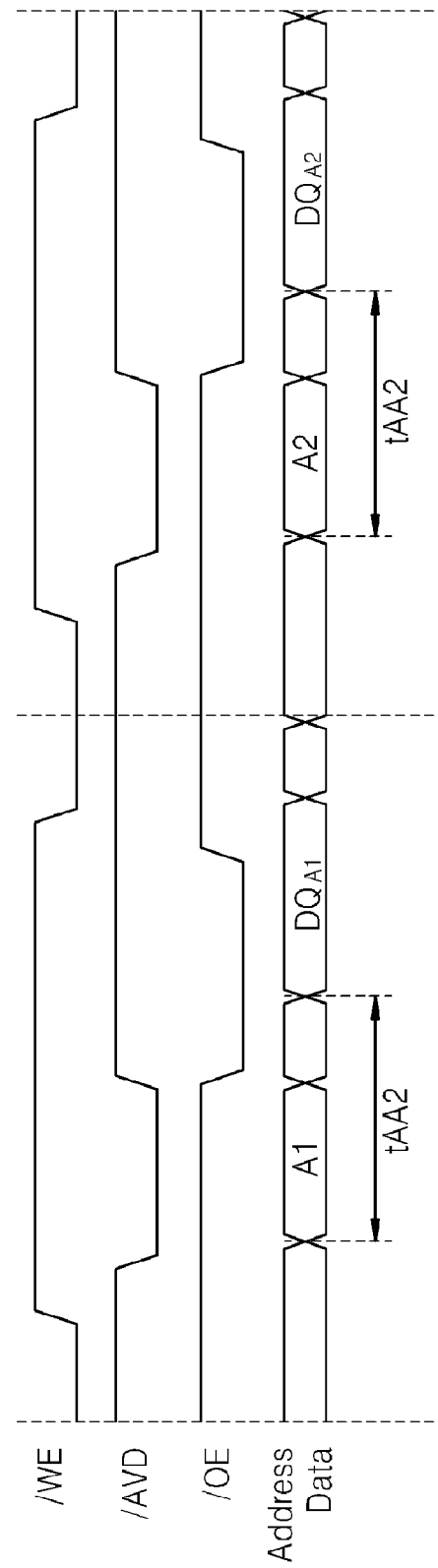
FIG. 3 is a timing diagram for reference in describing another example of an asynchronous read operation in a memory device.

FIG. 3 is a timing diagram for explaining another example of an asynchronous read operation in a memory device. Referring to FIG. 3, after a latency tAA2 has passed from receipt of a first address A1, a first data DQA1 is read. Next, after the latency tAA2 has passed from receipt of a second address A2, a second data DQA2 is read. As in the asynchronous read operation in FIG. 2, in the asynchronous read operation in FIG. 3, the first and second data DQA1 and DQA2 are intermittently read.

In the asynchronous read operation in FIG. 2, the first and second addresses A1 and A2 and the first and second data DQA1 and DQA2 may be read through different paths. On the other hand, in the asynchronous read operation in FIG. 3, the first and second addresses A1 and A2 and the first and second data DQA1 and DQA2 may be read through the same path.

As discussed previously herein, the phase-change memory cell is an example of a resistance variable memory cell. In the embodiments that follow, non-limiting examples are presented in which variable-resistive memory cell arrays are implemented by phase-change memory cell arrays (e.g., a PRAM memory cell arrays).

Figure 4:
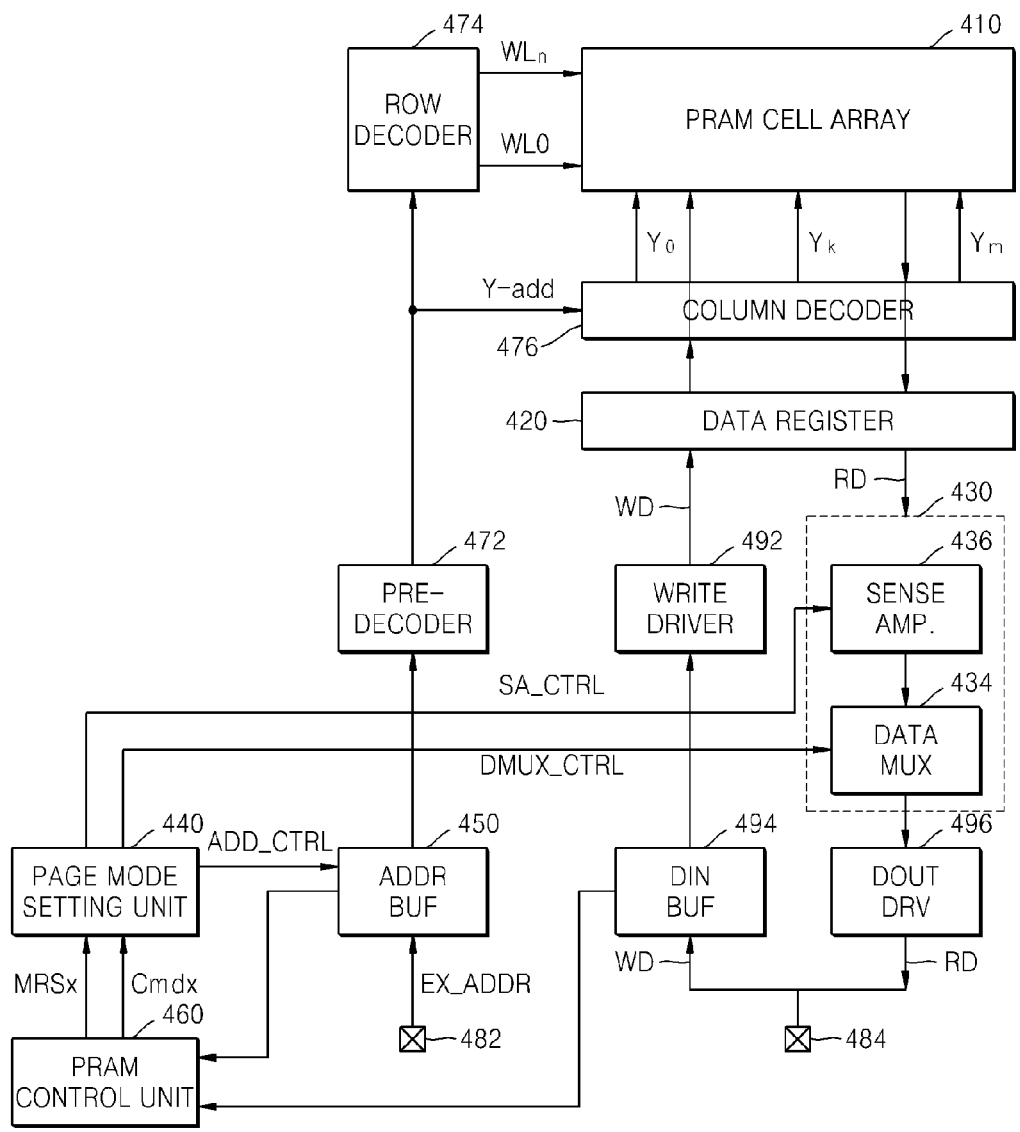
FIG. 4 is a block diagram of a phase-change random access memory (PRAM) device according to an embodiment of the inventive concept.

FIG. 4 is a block diagram of a PRAM device according to a non-limiting embodiment of the inventive concept.

Referring to FIG. 4, the PRAM device 400 of this example includes a phase-change memory (PRAM) cell array 410, a data register 420, a data output unit 430, and a page mode setting unit 440. In addition, the PRAM device 400 of this example includes an address buffer 450, a PRAM control unit 460, a pre-decoder 472, a row decoder 474, a column decoder 476, a write driver 492, a data input (DIN) buffer 494, and a data output (DOUT) driver 496.

The phase-change memory cell array 410 includes a plurality of phase-change memory cells. In operation, the data register 420 prefetches read data of the phase-change memory cell array 410, the data output unit 430 receives the prefetched read data from the data register 420 and outputs the read data, and the page mode setting unit 440 sets a page mode for the read data to be output through the data output unit 430. Examples of page modes (namely, a first page mode and a second page mode) are described below with reference to FIGS. 5 and 6.

Figure 5:
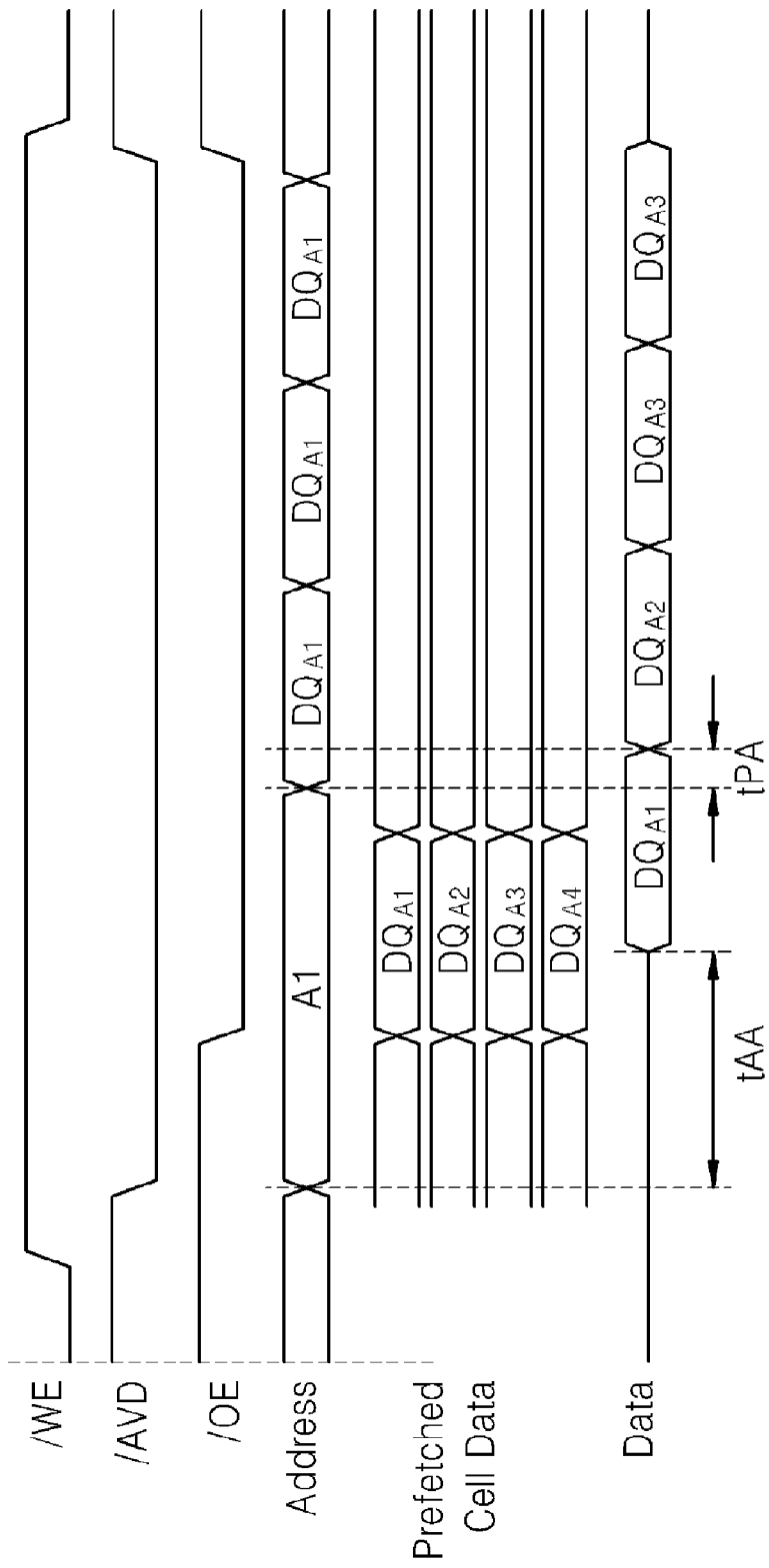
FIG. 5 is a timing diagram for reference in describing a first page mode of the PRAM device illustrated in FIG. 4 according to an embodiment of the inventive concept.

FIG. 5 is a timing diagram for explaining a first page mode of the PRAM device shown in FIG. 4.

The first page mode may be used in a DeMUX product in which separate address pins and data pins are provided (i.e., address and data are read through different pins). In addition, in the first page mode, data can be read in units of data pre-fetched in the data register 420.

Referring to FIG. 5, in the first page mode, the data output unit 430 sequentially reads a plurality of read data DQA1~DQA4 prefetched in the data register 420 as page addresses A1~A4 are sequentially received.

In comparing FIGS. 2 and 5 (with the assumption that tAA1 in FIG. 2 is the same as tAA in FIG. 5), the time period required to read four read data is shorter in FIG. 5 than in FIG. 2 by 3*tAA−3*tPA. As non-limiting examples only, tAA may be set to 100 ns, and tPA may be set to 20 ns.

When a signal /AVD is a logic low, after the start page address A1 has been received and then a signal /OE undergoes a logic transition, the prefetched read data DQA1~DQA4 are sequentially output.

Figure 6:
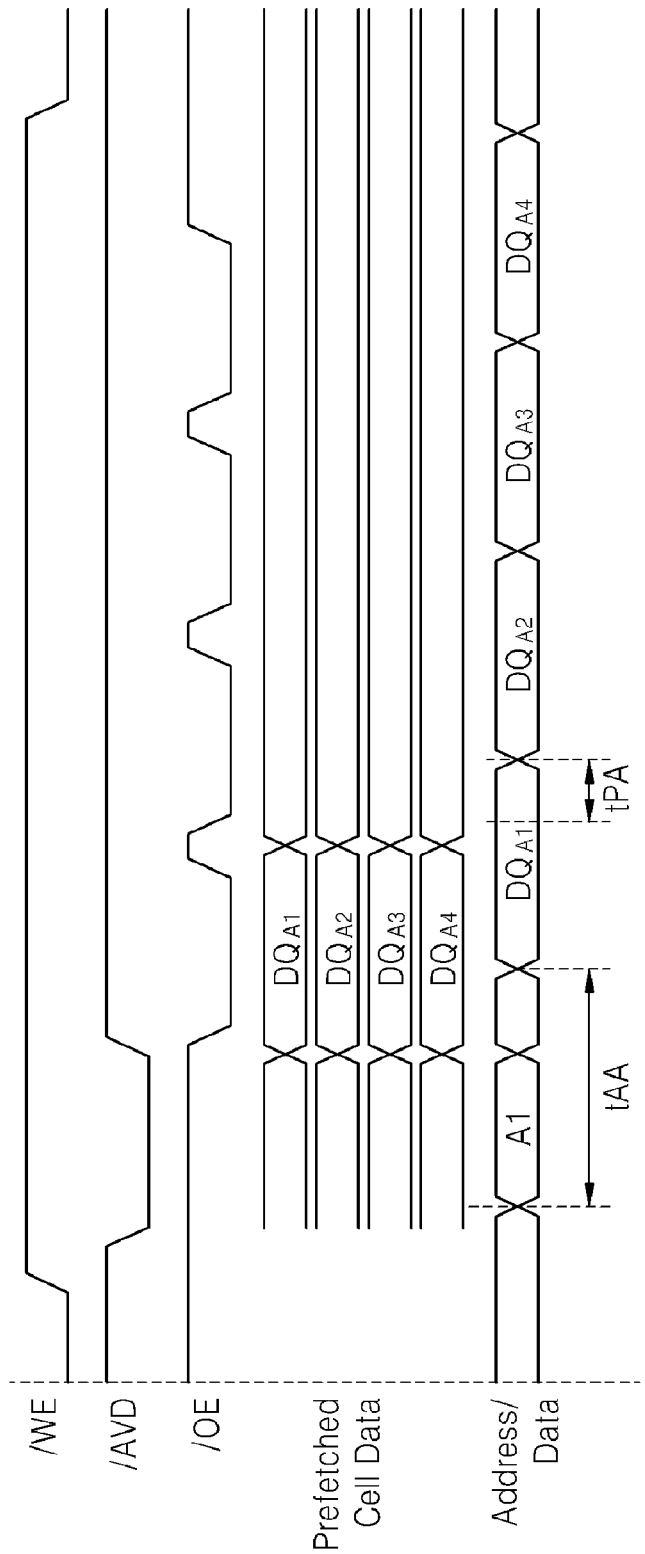
FIG. 6 is a timing diagram for reference in describing a second page mode of the PRAM device illustrated in FIG. 4 according to an embodiment of the inventive concept.

FIG. 6 is a timing diagram for explaining a second page mode of the PRAM device in FIG. 4.

The second page mode may be used in a MUX product in which separate address pins and data pins are not provided (i.e., (address and data are read through a same pin or pins). In addition, in the second page mode, data can be read in units of data prefetched in the data register 420.

Referring to FIG. 6, in the second page mode, the data output unit 430 sequentially reads the read data DQA1~DQA4 prefetched in the data register 420 after the start page address A1 among the page addresses A1~A4 has been received. In comparing FIGS. 3 and 6 (with the assumption that tAA2 in FIG. 3 is the same as tAA in FIG. 6), the time period required to read four read data is shorter in FIG. 6 than in FIG. 3 by 3*tAA−3*tPA. As in the case of FIG. 5, tAA may be set to 100 ns, and tPA may be set to 20 ns. Again, however, these are merely examples.

When the signal /AVD is a logic low, after the start page address A1 has been received, the prefetched read data DQA1~DQA4 are sequentially output while the signal /OE is toggled. In addition, referring to FIG. 6, in the second page mode, the page addresses A2~A4 other than the start page address A1 may not affect the operation of sequentially reading the prefetched read data DQA1~DQA4.

Referring back to FIG. 4, the page mode setting unit 440 may set to either the first page mode or the second page mode based on a mode register set (MRSx) or a combination of commands (CMDx) that are received from the PRAM control unit 460.

The data output unit 430 may include at least one sense amplifier (SENSE AMP.) 436 and at least one data multiplexer (DATA MUX) 434.

The sense amplifier 436 and the data multiplexer 434 may operate either in the first or second page modes as described above, upon reception of control signals SA_CTRL and DMUX_CTRL that are generated in the page mode setting unit 440.

The data of the phase-change memory cell array 410 are transmitted to the output driver (DOUT DRV) 496 through the data register 420, the sense amplifier 436 and then the data multiplexer 434, and then externally output through the output driver 496 and an input/output pad 484. The data received through the input/output pad 484 may be written to the phase-change memory cell array 410 via the input (DIN) buffer 494 and the write driver 492.

An external address EX_ADDR received through an address pad 482 is transmitted to a pre-decoder 472 through an address buffer 450. The pre-decoder 472 generates and transmits a row address X-add and a column address Y-add, respectively, to a row decoder 474 and a column decoder 476. The row decoder 474 selects one of a plurality of rows WL0~WLn of the phase-change memory cell array 410. The column decoder 476 selects one of a plurality of columns Y0~Ym of the phase-change memory cell array 410. One of the rows WL0~WLn selected by the row decoder 474 and one of the columns Y0~Ym selected by the column decoder 476 may be determined according to the row address X-add and the column address Y-add, respectively, received from the pre-decoder 472.

Figure 7:
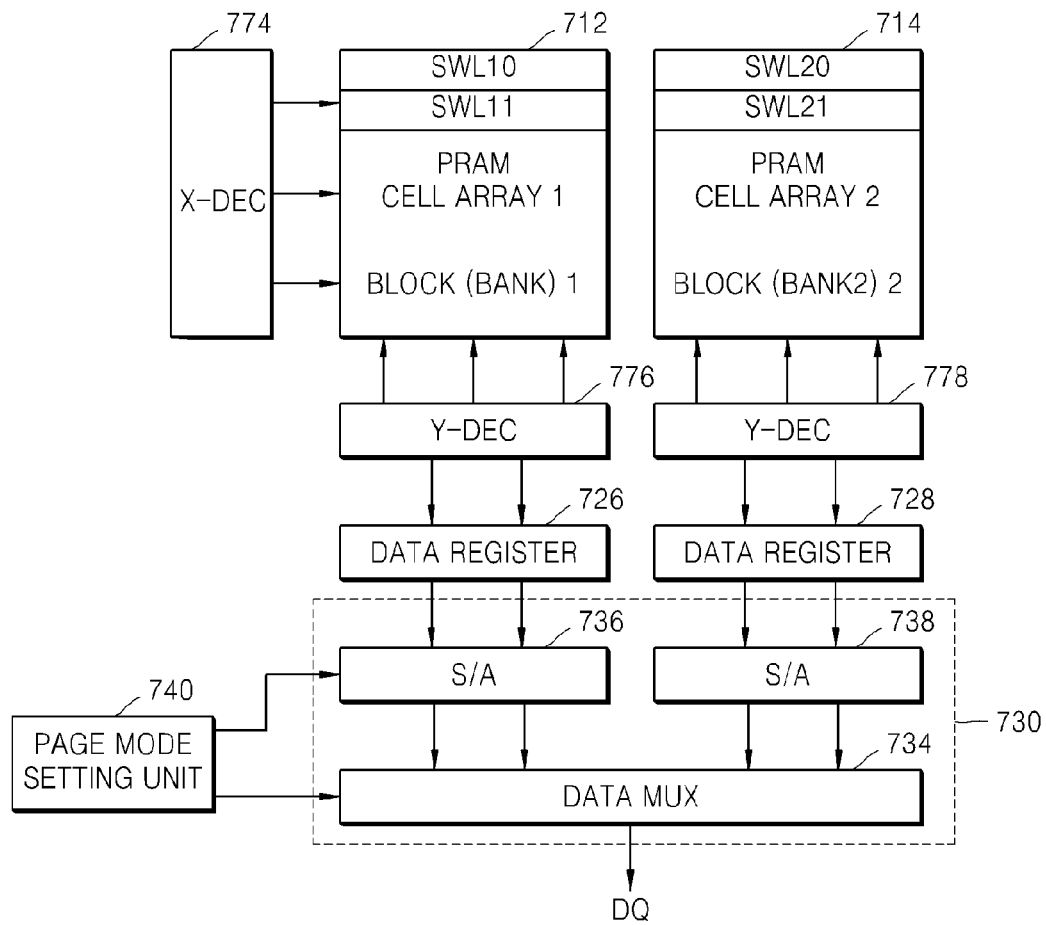
FIG. 7 is a block diagram of a PRAM device according to another embodiment of the inventive concept.

FIG. 7 is a block diagram of a PRAM device according to another embodiment of the inventive concept.

Referring to FIG. 7, the PRAM device according to this example of the inventive concept includes a first phase-change memory cell array 712, a second phase-change memory cell array 714, a first data register 726, a second data register 728, a data output unit 730, a page mode setting unit 740, an x-decoder 774, and first and second y-decoders 776 and 778.

The first data register 726 prefetches read data of the first phase-change memory cell array 712. The second data register 728 prefetches read data of the second phase-change memory cell array 714. The data output unit 730 receives the pre-fetched read data from the first and second data registers 726 and 728 and outputs the received data. The page mode setting unit 740 may set a page mode for the read data to be output through the data output unit 730. Examples of page modes (namely, a third page mode and fourth page mode) are described below with reference to FIGS. 8 and 9.

Figure 8:
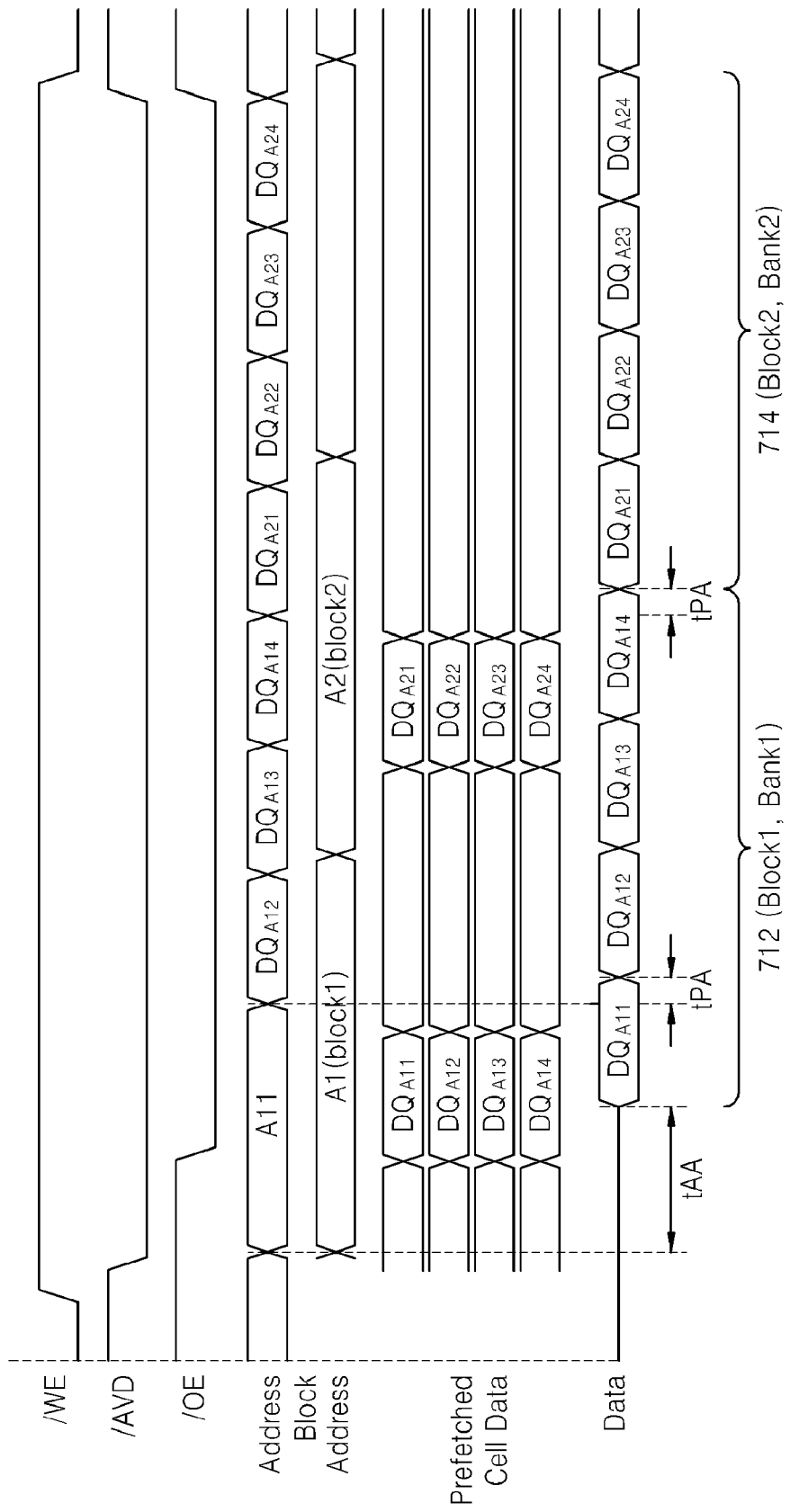
FIG. 8 is a timing diagram for reference in describing a third page mode of the PRAM device illustrated in FIG. 7 according to an embodiment of the inventive concept.

FIG. 8 is a timing diagram for explaining a third page mode of the PRAM device in FIG. 7.

The third page mode may be used in a DeMUX product (an address and data are read through different pins) in which separate address pins and data pins are utilized. In addition, in the third page mode, data can be read in data units that are equal to or larger than data units prefetched in the first and second data registers 726 and 728.

Referring to FIGS. 7 and 8, in the third page mode, the data output unit 430 sequentially reads the read data DQA11~DQA14 prefetched in the first data register 726 as page addresses A11~A14 of the first phase-change memory cell array 712 are sequentially received. Next, the data output unit 430 sequentially reads the read data DQA21~DQA24 prefetched in the second data register 728 as page addresses A21~A24 of the second phase-change memory cell array 714 are sequentially received.

The data output unit 430 may include a first sense amplifier 736, a second sense amplifier 738, and a data multiplexer 734. The first sense amplifier 736 and the second sense amplifier 738 amplify the read data prefetched respectively in the first data register 726 and the second data register 728.

The data multiplexer 734 receives the read data from the first and second sense amplifiers 736 and 738 and outputs the received read data. In the third page mode, after the read data amplified in the first sense amplifier 736 have been sequentially read, the read data amplified in the second sense amplifier 738 may be sequentially read. In other words, an address transition may be induced between the data that do not share a single sense amplifier.

The fourth page mode may be used in a MUX product (an address and data are read through a same pin) in which separate address pins and data pins are not utilized. In addition, in the fourth page mode, data can be read in data units that are equal to or larger than data units prefetched in the first and second data registers 726 and 728.

Referring to FIG. 7, in the fourth page mode, the data output unit 730 sequentially outputs the read data prefetched in the first data register 726 when a first page address of the first phase-change memory cell block 712 is received. Then, the data output unit 430 sequentially outputs the read data prefetched in the second data register 728 when a first page address of the second phase-change memory cell block 714 is received.

In the example of FIG. 7, the X-decoder (X-DEC) 774 selects a row of the first phase-change memory cell block 712 and a row of the second phase-change memory cell block 714. The first Y-decoder (Y-DEC) 776 selects a column of the first phase-change memory cell block 712, and the second Y-decoder (Y-DEC) 778 selects a column of the second phase-change memory cell block 714.

Figure 9:
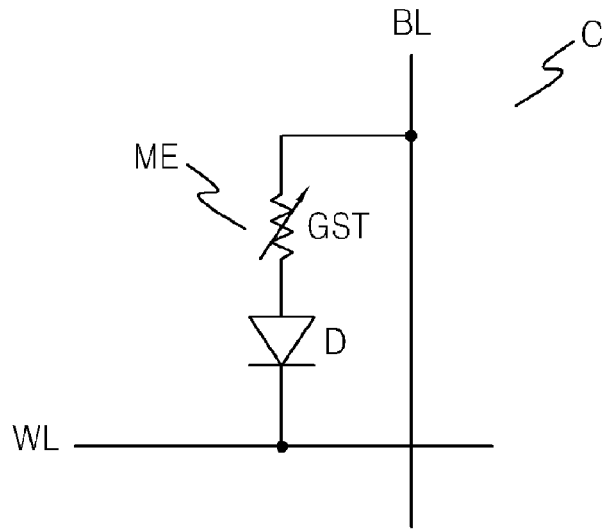
FIG. 9 is an equivalent circuit diagram of a diode-type phase-change memory cell that may be included in the PRAM devices illustrated in FIGS. 4 and 7.

FIG. 9 is an equivalent circuit diagram of a diode-type phase-change memory cell that can be included in the PRAM devices shown in FIGS. 4 and 7.

In FIG. 9, the diode-type phase-change memory cell is denoted as C. The phase-change memory cell arrays in FIGS. 4 and 7 may include a plurality of diode-type phase-change memory cells each of which has the structure as illustrated in FIG. 9.

As shown in FIG. 9, the diode-type phase-change memory cell (C) includes a memory element (ME) and a P-N diode (D). A phase-change material (Ge-Sb-Te; GST) is connected between a bit line BL and a P-junction of the diode (D), and an N-junction of the diode D is connected to a word line WL.

The memory device (ME) contains the phase-change material (GST). The phase-change material (GST) in the diode-type phase-change memory cell (C) is crystallized or becomes amorphous depending on applied temperature and heating time, thereby storing information. To induce the phase-change material (GST) to change its phase, a high temperature of 900° C. or higher is required. This high temperature can be obtained by Joule heating induced by the current flowing through the diode-type phase-change memory cell (C).

Figure 10:
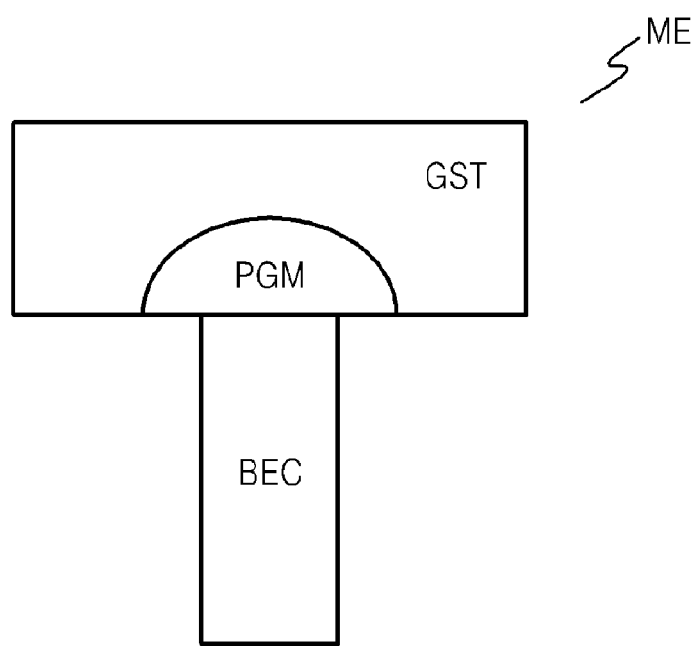
FIG. 10 is a cross-sectional view of a memory element of the memory cell illustrated in FIG. 9.

FIG. 10 is a cross-sectional view of the memory device (ME) containing the phase-change material (GST) in FIG. 9.

Referring to FIG. 10, when current generated as described above is supplied to a lower electrode (BEC) of the memory device (ME), the volume and phase of a site (PGM) in the phase-change material (GST) that contacts the lower electrode (BEC) change. The changes of the site (PGM) affect the crystalline condition of the phase-change material GST.

Figure 11:
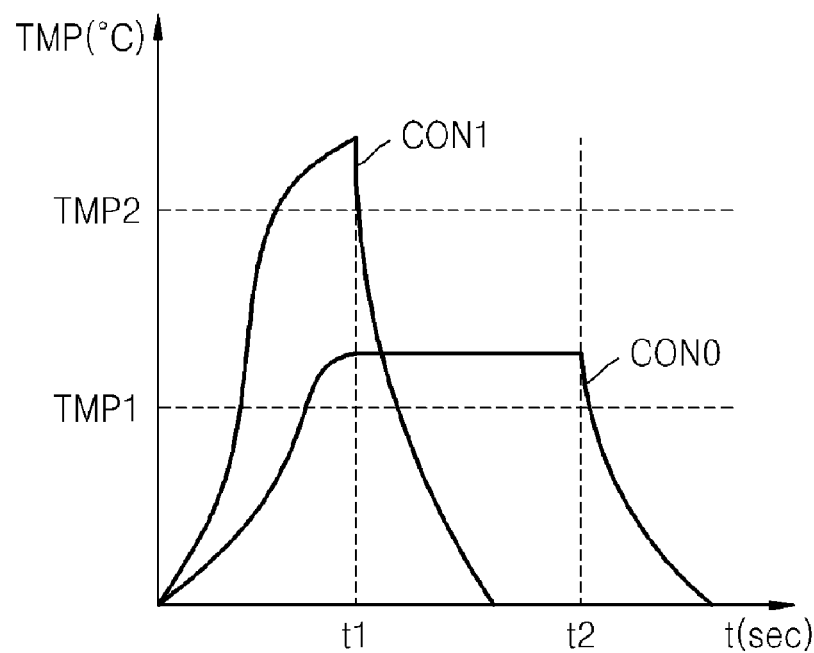
FIG. 11 is a graph showing heat treatment characteristics during programming of the phase-change material (GST) illustrated in FIGS. 9 and 10.

FIG. 11 is a graph showing heat treatment characteristics during programming of the phase-change material (GST) shown in FIGS. 9 and 10. In FIG. 11, the graph denoted as "CON1" shows a condition for the phase-change material (GST) to change to the amorphous state, and the graph denoted as "CON0" shows a condition for the phase-change material (GST) to change to the crystalline state. The write and read operations in a PRAM device will be described below with reference to FIGS. 9 through 11.

First, the write operation is performed as follows. To store information "1", the phase-change material (GST) is heated for a period of time (t1) to a melting temperature (TMP2) of higher and then rapidly cooled, so that the phase-change material (GST) changes to the amorphous state. This amorphous state is defined as information "1". The amorphous state is also referred to as "Reset" state. To store information "0", the phase-change material (GST) is heated to a crystallization temperature (TMP1) or higher, maintained at the same temperature for a period of time (t2), and then slowly cooled. As a result, the phase-change material (GST) changes to the crystalline state. This state is defined as information "0". The crystalline state is also referred to as "Set" state.

Next, for the read operation, a phase-change memory cell (C) to be read is selected as corresponding bit line (BL) and word line (WL) are selected. As a read current is supplied to the selected phase-change memory cell (C), the information "1" and "0" are distinguished from one another based on voltage variations according to the resistance of the phase-change material (GST).

Figure 12:
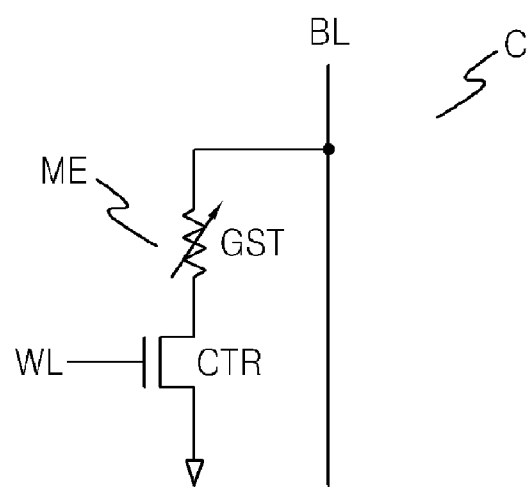
FIG. 12 is an equivalent circuit diagram of a metal-oxide-semiconductor (MOS) type phase-change memory cell that may be included in the phase-change memory cell arrays illustrated in FIGS. 4 and 7.

FIG. 12 is an equivalent circuit diagram of a metal-oxide-semiconductor (MOS) type phase-change memory cell that can be included in the phase-change memory cell arrays in FIGS. 4 and 7. In this case, the phase-change memory cell (C) and a cell transistor (CTR) are connected in series between a bit line (BL) and a reference potential (ground), and a gate of the transistor is connected to a word line (WL). The phase-change memory cell arrays shown in FIGS. 4 and 7 may include a plurality of MOS-type phase-change memory cells each having the structure shown in FIG. 12.

In addition, as suggested previously herein, the phase-change memory cells in FIGS. 11 and 12 may be replaced with other types of resistance-variable memory cells. Examples of resistance-variable memory cells include a magnetoresistive random access memory cells, a resistive random access memory cells, a Racetrack memory cells, and the like.

While the inventive concept has been particularly shown and described with reference to exemplary embodiments thereof, it will be understood that various changes in form and details may be made therein without departing from the spirit and scope of the following claims.

What is claimed is:

1. A resistance variable memory device comprising:
   a resistance variable memory cell array;
   a data register that prefetches read data of the resistance variable memory cell array;
   a data output unit that receives the prefetched read data from the data register and outputs the received data; and
   a page mode setting unit that sets one of a first page mode and a second page mode as a page mode,
   wherein, in the first page mode, the data output unit sequentially reads the read data prefetched in the data register as page addresses are sequentially received, and in the second page mode, the data output unit sequentially reads the read data prefetched in the data register after a start page address among a plurality of page addresses has been received.

2. The resistance variable memory device of claim 1, wherein, in the first page mode, the data output unit sequentially reads the prefetched read data through a path which is different from a path through which the page addresses are received.

3. The resistance variable memory device of claim 1, wherein, in the second page mode, the data output unit sequentially reads the prefetched read data through a same path as a path through which the page addresses are received.

4. The resistance variable memory device of claim 1, wherein, in the second page mode, the page addresses other than the start page address do not affect the operation of sequentially reading the prefetched read data.

5. The resistance variable memory device of claim 1, wherein the data output unit comprises:
   at least one sense amplifier that receives the prefetched read data from the data register and amplifies the received data; and
   at least one data multiplexer that receives and outputs the read data from the at least one sense amplifier.

6. The resistance variable memory device of claim 1, further comprising at least one address buffer that receives the page addresses.

7. The resistance variable memory device of claim 1, wherein the page mode setting unit sets one of the first page mode and the second page mode based on a mode register set (MRS) or a combination of commands.

8. The resistance variable memory device of claim 1, wherein the resistance variable memory cell array comprises a plurality of metal-oxide-semiconductor (MOS) type phase-change memory cells or a plurality of diode-type phase-change memory cells.

9. A resistance variable memory device comprising:
   a first resistance variable memory cell array;
   a second resistance variable memory cell array;
   a first data register that prefetches read data of the first resistance variable memory cell array;
   a second data register that prefetches read data of the second resistance variable memory cell array;
   a data output unit that receives the prefetched read data from the first and second data registers and outputs the received data; and
   a page mode setting unit that sets one of a first page mode and a second page mode as a page mode,
   wherein, in the first page mode, the data output unit sequentially reads the read data prefetched in the first data register as page addresses of the first resistance variable memory cell array are sequentially received, and then sequentially reads the read data prefetched in the second data register as page addresses of the second resistance variable memory cell array are sequentially received, and
   wherein, in the second page mode, the data output unit sequentially reads the read data prefetched in the first data register when a start page address of the first resistance variable memory cell block is received, and then sequentially reads the read data prefetched in the second data register when a start page address of the second resistance variable memory cell array is received.

10. The resistance variable memory device of claim 9, wherein the data output unit comprises:
    first and second sense amplifiers that receive the prefetched read data respectively from the first and second data registers and amplify the received data; and
    a data multiplexer that receives the read data from the first and second sense amplifiers and outputs the received data,
    wherein, in the first page mode, the data multiplexer sequentially reads the read data amplified in the first sense amplifier, and then sequentially reads the read data amplified in the second sense amplifier.

11. The resistance variable memory device of claim 9, wherein, in the second page mode, the data output unit sequentially reads the prefetched read data through a path that is different from a path through which the page addresses are received.

12. The resistance variable memory device of claim 9, wherein, in the second page mode, the data output unit sequentially reads the prefetched read data through a same path as a path through which the page addresses are received.

13. The resistance variable memory device of claim 9, wherein the variable resistance memory cell array comprises a plurality of metal-oxide-semiconductor (MOS) type phase-change memory cells or a plurality of diode-type phase-change memory cells.

14. A resistance variable memory device comprising:
  a resistance variable memory cell array;
  a data register that prefetches read data of the resistance variable memory cell array;
  a data output unit that receives the prefetched read data from the data register and outputs the received data; and
  a common address/data pin that receives page addresses and receives the read data from the data output unit, and outputs the received read data,
  wherein the data output unit sequentially reads the read data prefetched in the data register through the common address/data pin after a start page address among a plurality of page addresses has been received through the common address/data pin.

15. The resistance variable memory device of claim 14 further comprising:
  a second resistance variable memory cell array; and
  a second data register that prefetches read data of the second resistance variable memory cell array, wherein the data output unit that receives the prefetched read data from the second data register outputs the received data, and after the data output unit sequentially reads the read data prefetched in the data register, the data output unit sequentially reads the read data prefetched in the second data register through the common address/data pin when a start page address of the second resistance variable memory cell array block is received through the common address/data pin.

* * * * *